(12) United States Patent
Gao

(10) Patent No.: US 11,744,043 B2
(45) Date of Patent: Aug. 29, 2023

(54) ELECTRONICS PACKAGING FOR PHASE CHANGE COOLING SYSTEMS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 63 days.

(21) Appl. No.: 17/354,216

(22) Filed: Jun. 22, 2021

(65) Prior Publication Data

US 2022/0408601 A1 Dec. 22, 2022

(51) Int. Cl.
*H05K 7/20* (2006.01)

(52) U.S. Cl.
CPC ..... *H05K 7/20318* (2013.01); *H05K 7/20327* (2013.01); *H05K 7/20818* (2013.01)

(58) Field of Classification Search
CPC .......... H05K 7/20381; H05K 7/20318; H05K 7/20327; H05K 7/20818
USPC .................................................. 361/679.53
See application file for complete search history.

(56) References Cited

U.S. PATENT DOCUMENTS

| | | | | |
|---|---|---|---|---|
| 3,586,101 A * | 6/1971 | Chu | ...................... | F25B 23/006 174/15.1 |
| 4,501,123 A * | 2/1985 | Ina | ...................... | H01F 27/18 62/119 |
| 4,619,316 A * | 10/1986 | Nakayama | ............. | F28F 13/187 257/713 |
| 4,712,387 A * | 12/1987 | James | ...................... | F25D 16/00 165/104.11 |
| 4,949,164 A * | 8/1990 | Ohashi | ................... | H01L 23/427 165/80.4 |
| 5,297,621 A * | 3/1994 | Taraci | ..................... | H05K 7/203 324/750.08 |
| 5,349,499 A * | 9/1994 | Yamada | ................ | H01L 23/427 165/104.33 |
| 8,014,150 B2 * | 9/2011 | Campbell | ............... | H05K 7/203 165/185 |
| 8,619,425 B2 * | 12/2013 | Campbell | .............. | H05K 7/203 361/689 |
| 8,739,406 B2 * | 6/2014 | Campbell | ............... | F28F 3/046 29/890.035 |
| 8,806,749 B2 * | 8/2014 | Campbell | .......... | H05K 7/20772 174/15.1 |
| 9,328,964 B2 * | 5/2016 | Shelnutt | ............ | H05K 7/20818 |
| 10,416,736 B2 * | 9/2019 | Dupont | ............. | H05K 7/20936 |
| 10,470,337 B2 * | 11/2019 | Uchida | ..................... | F25D 9/00 |
| 10,999,951 B2 * | 5/2021 | Tsunoda | ............. | H05K 7/20772 |

(Continued)

*Primary Examiner* — Anatoly Vortman
(74) *Attorney, Agent, or Firm* — WOMBLE BOND DICKINSON (US) LLP

(57) ABSTRACT

An electronics system packaging/enclosure can include an external chassis, an internal chassis housed within the external chassis, and a condenser chassis housed within the external chassis, where the condensing chassis is situated on top of the internal chassis. The electronics system packaging can include a condenser unit housed in the condensing chassis to condense a vapor into a two-phase liquid coolant, and IT electronics housed within the internal chassis, where the internal chassis is at least partially submerged within the two-phase liquid coolant, where, heat generated within the internal chassis is transferred to the two-phase liquid coolant thereby causing at least some of the two-phase liquid coolant to turn into a vapor.

17 Claims, 6 Drawing Sheets

(56) References Cited

U.S. PATENT DOCUMENTS

| | | | |
|---|---|---|---|
| 11,076,508 B2* | 7/2021 | Gao | H05K 7/20836 |
| 11,284,543 B2* | 3/2022 | Gao | H05K 7/20509 |
| 11,357,130 B2* | 6/2022 | Manousakis | H05K 7/20309 |
| 11,375,638 B2* | 6/2022 | Cheng | H05K 7/20318 |
| 2017/0265336 A1* | 9/2017 | Ichinose | H05K 7/20772 |
| 2017/0290205 A1* | 10/2017 | Shepard | H05K 7/20936 |

* cited by examiner

US 11,744,043 B2

ELECTRONICS PACKAGING FOR PHASE CHANGE COOLING SYSTEMS

FIELD OF THE INVENTION

Embodiments of the present invention relate generally to servers and data center cooling. More particularly, embodiments of the invention relate to electronics packaging for phase change cooling systems.

BACKGROUND

Thermal management for a data center that includes several active electronic racks is critical to ensure proper performance of servers and/or other IT equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit.

Recently, data centers have been deploying more high-power density electronic racks, where more high-density chips are packaged closer together to provide more computing power. Cooling these high-density racks by maintaining a proper thermal environment may be an issue with existing cooling systems, such as any air cooling based system. For instance, although the cooling air may maintain the thermal environment with more conventional (or lower-density) racks, the unit may be unable to effectively cool high-power density racks because they may generate heat load at a higher rate due to the higher density electronics. Or significant cost may be needed for upgrading an air cooling system to satisfy a cooling requirement of a high density deployment. Another challenge for air cooling high density racks is moving a large amount of airflow sufficient to cool the racks.

Immersion cooling, on the other hand, which involves at least partially submerging electronics in a dielectric solution is a feasible solution for high-density electronics. Implementing immersion cooling in existing data centers, however, has challenges. Existing solutions for immersion systems are mainly container-based solutions where IT equipment are submerged in an immersion tank. Such a solution significantly lacks serviceability.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
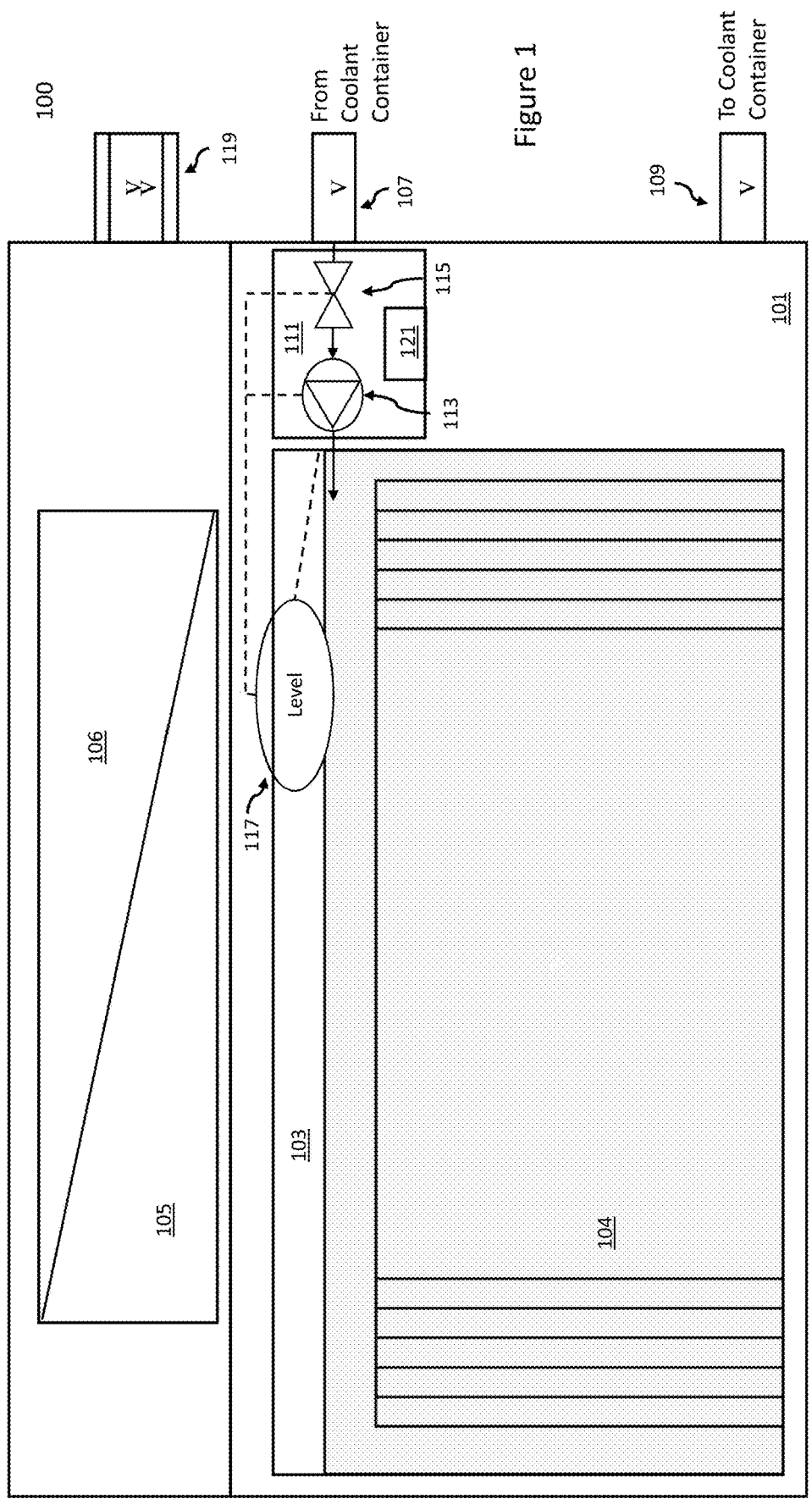
FIG. 1 is a block diagram illustrating a side view of a cooling system 100 according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Aspect of the present disclosure are directed to a two-phase immersion cooling system with reliable chassis enclosures. The chassis enclosures can include chassis within a chassis to enhance enclosure reliability, where each chassis is fully sealed. One or more management modules are connected in between an internal and an external chassis to manage cooling fluid and/or two-phase coolant used by these chassis.

According to a first aspect, an electronics system packaging includes an external chassis, an internal chassis housed within the external chassis, and a condenser chassis housed within the external chassis, the condensing chassis situated on top of the internal chassis. The electronics system packaging includes a condenser unit housed in the condensing chassis to condense a vapor into liquid phase, and IT electronics housed within the internal chassis, where the IT electronics are at least partially submerged within the two-phase liquid coolant, where, while the IT electronics provide IT services, the IT electronics generate heat that is transferred to the two-phase liquid coolant thereby causing at least some of the two-phase liquid coolant to turn into a vapor.

In one embodiment, the internal chassis, the external chassis, and/or the condenser chassis includes a sealed container. In one embodiment, the electronic rack further includes a liquid level sensor coupled to the internal chassis to sense a level of the two-phase liquid coolant contained within the internal chassis. In one embodiment, the electronic rack further includes a two-phase coolant management module housed within the external chassis but outside of the internal chassis.

In one embodiment, the two-phase coolant management module is coupled between a first inlet port of the external chassis and an inlet port of the internal chassis, wherein the two-phase coolant management module is to regulate a flow of a two-phase liquid coolant from a coolant unit to the IT electronics within the internal chassis. In one embodiment, the electronics system packaging further includes a cooling liquid management module housed within the external chassis but outside of the condenser chassis.

In one embodiment, the cooling liquid management module couples a second inlet port of the external chassis to an inlet port of the condenser chassis, wherein the cooling liquid management module is to regulate a flow of cooling liquid from an external cooling source to the condenser unit within the condenser chassis. In one embodiment, the liquid level sensor is to cause the two-phase coolant management module to regulate a flow of the two-phase liquid coolant and the cooling liquid management module to regulate a flow of the cooling liquid.

In one embodiment, the electronics system packaging further includes a coolant unit coupled to the electronics system packaging. The coolant unit includes a charging pump, a draining pump, and a first three-way valve with a first port coupled to the charging pump, a second port coupled to an inlet port of the internal chassis, and a third port coupled to a central coolant system. The coolant unit includes a second three-way valve with a fourth port coupled to the draining pump, a fifth port coupled to an output port of the internal chassis, and a sixth port coupled to the central coolant system. In one embodiment, the electronics system packaging further includes a condenser pump to circulate a cooling liquid from a cooling source to the condenser unit to cause the condenser unit to condenser the vapor to liquid phase.

In one embodiment, the internal chassis housed within the external chassis includes a number of internal chassis, where each of the internal chassis houses corresponding IT electronics that provides IT services. In one embodiment, each of the internal chassis includes a corresponding fluid level sensor coupled to the internal chassis and a corresponding two-phase coolant management module, where the corresponding fluid level sensor to cause the corresponding two-phase coolant management module to regulate a flow of a two-phase liquid coolant from the coolant unit to the internal chassis. In one embodiment, the condenser chassis and the internal chassis are packaged within the external chassis, where the internal chassis includes a number of internal chassis.

According to a second aspect, a system monitors a liquid level of a two-phase liquid coolant within an internal chassis, where the internal chassis houses IT electronics, where the IT electronics are at least partially submerged within the two-phase liquid coolant, where, while the IT electronics provide IT services, the IT electronics generate heat that is transferred to the two-phase liquid coolant thereby causing at least some of the two-phase liquid coolant to turn into a vapor. The system controls an operation of a two-phase coolant pump coupled to the internal chassis and a charging pump that is coupled to a coolant unit, including increasing a speed of the two-phase coolant pump and/or the charging pump if the liquid level is below a first predetermined threshold. The system controls an operation of a condenser pump coupled to the condenser chassis, including increasing a speed of the condenser pump if the liquid level is below a second predetermined threshold.

In one embodiment, the system further controls an operation of a valve coupled to the two-phase coolant pump, where if the valve is opened, the two-phase liquid coolant is to flow to the internal chassis, where if the valve is closed, the two-phase liquid coolant is to flow to an another internal chassis.

According to a third aspect, an information technology (IT) equipment cooling system includes a coolant unit to supply two-phase liquid coolant and an electronics system packaging coupled to the coolant unit. The electronics system packaging includes an external chassis, an internal chassis housed within the external chassis, and a condenser chassis housed within the external chassis, the condensing chassis situated on top of the internal chassis. The electronics system packaging includes a condenser unit housed in the condensing chassis to condense a vapor into a two-phase liquid coolant, and IT electronics housed within the internal chassis, where the IT electronics are at least partially submerged within the two-phase liquid coolant, where, while the IT electronics provide IT services, the IT electronics generate heat that is transferred to the two-phase liquid coolant thereby causing at least some of the two-phase liquid coolant to turn into a vapor.

FIG. 1 is a block diagram illustrating a side view of a cooling system 100 according to one embodiment. As shown, cooling system 100 can include electronics system packaging that can include an external chassis 101, an internal chassis 103, and a cooling chassis 105. Both cooling chassis 105 and internal chassis 103 can be packaged within external chassis 101. In one embodiment, cooling chassis 105 can be located on top of internal chassis 103. In one embodiment, only internal chassis 103, but not cooling chassis 105, is packaged within external chassis 101.

Internal chassis 103 can be operated as an immersion container and can include IT electronics 104 that are at least partially submerged in two-phase liquid coolant. The liquid coolant is dielectric coolant. IT electronics 104 may include processors, memory, storage devices that are commonly used by data processing systems such as servers. IT electronics 104, when operate, may generate heat. Cooling chassis 105 can include a condenser unit 106 that can be used to condense a vapor into liquid phase. Cooling chassis 105 include ports 119 to receive/release a cooling liquid circulated at condenser unit 106. Vapor from the internal chassis 103 rises up to the cooling chassis 105 and is condensed back into liquid phase.

In one embodiment, external chassis 101 includes coolant inlet port 107 and coolant outlet port 109, which are situated on external chassis 101. Coolant inlet port 107 can be used to receive two-phase liquid coolant into cooling system 100 from a two-phase liquid coolant container (such as container 411 of FIG. 4), and coolant outlet port 109 can be used to release two-phase liquid coolant from cooling system 100 to a two-phase liquid coolant container (such as container 411 of FIG. 4).

In one embodiment, cooling system 100 can include a management module 111 between inlet port 107 of external chassis 101 and an inlet port of internal chassis 103. Management module 111 can include controller 121, pump 113, and valve 115. It needs to be mentioned that management module 111 can either be a separate module or be package as part of external chassis 101.

In one embodiment, internal chassis 103 includes a fluid level sensor 117. Controller 121 can receive a signal from fluid level sensor 117 to monitor a fluid level within internal chassis 103. Controller 121 can use the received signal to control pump 113 and valve 115 of management module 111. In one scenario, if controller 121 detects a low fluid level (e.g., a level of two-phase liquid coolant) within internal chassis 103 via fluid level sensor 117, controller 121 activates pump 113 and valve 115 to pump in two-phase liquid coolant from the two-phase liquid coolant container.

Figure 2:
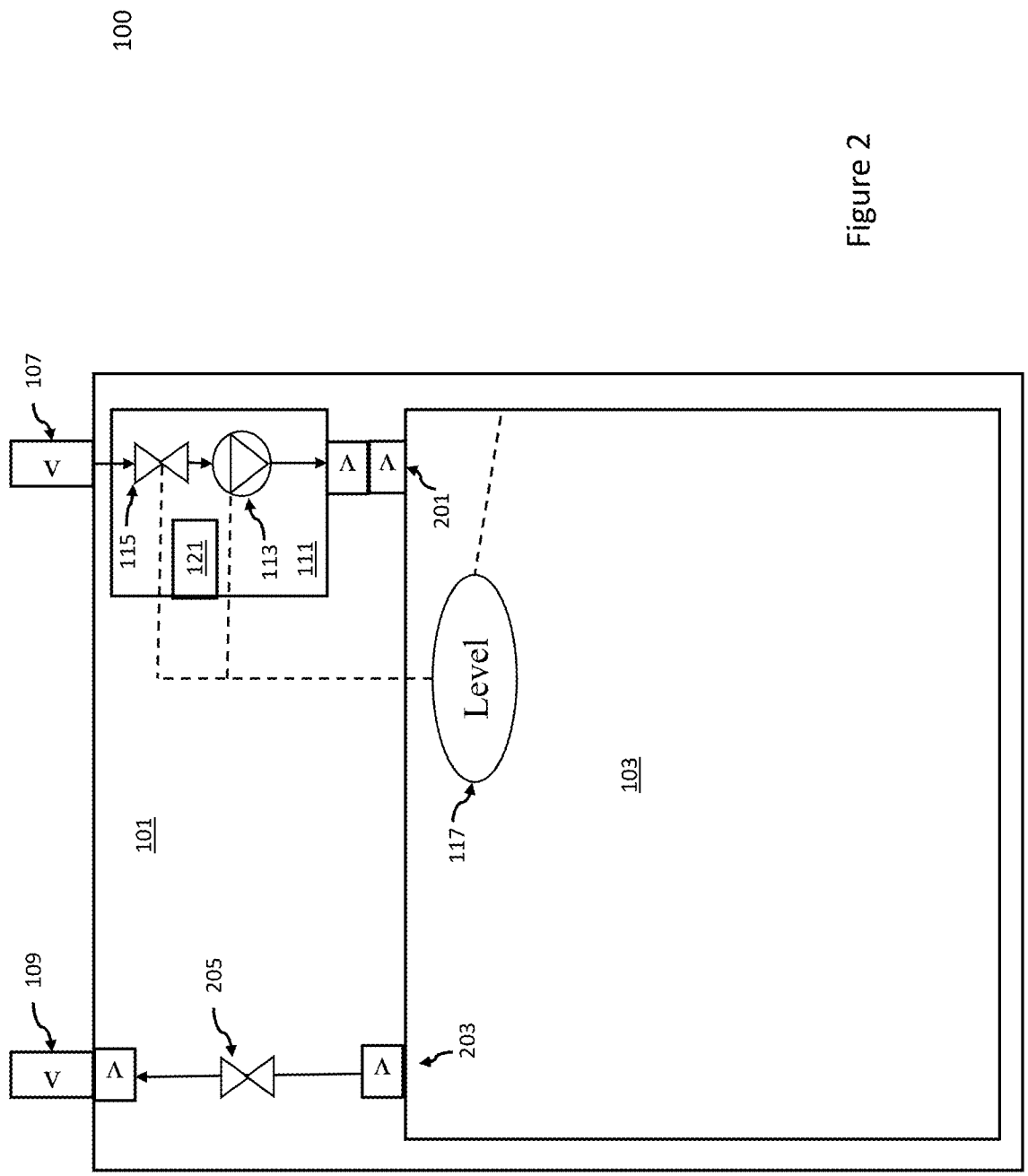
FIG. 2 is a block diagram illustrating a top view of a cooling system 100 according to one embodiment.

FIG. 2 is a block diagram illustrating a top view of a cooling system 100 according to one embodiment. FIG. 2 illustrates that internal chassis 103 is being contained within external chassis 101. In one embodiment, fluid level sensor 117 is packaged within internal chassis 103, where a signal indicator from fluid level sensor 117 can be used to activate/deactivate valve 115 and/or pump 113.

In one embodiment, internal chassis 103 includes inlet/output ports 201, 203 which are coupled to fluid ports 107, 109, respectively, via fluid connection lines. In one embodiment, cooling system 100 includes valve 205 at the fluid connection line between port 203 and port 109. The valve 205 can be set to open to release fluid from internal chassis 103 for services and maintenance.

In one embodiment, cooling system 100 can include management module 111 at the connection line between port 201 and port 107. Management module 111 can interface internal chassis 103 to external chassis 101. A signal from fluid level sensor 117 can activate/deactivate valve 115 and pump 113 of management module 111 to pump fluid into internal chassis 103.

In summary, the overall architecture of cooling system 100 illustrates that internal chassis 103 is being fully enclosed within external chassis 101, where internal chassis 103 can be filled with two-phase liquid coolant. Such a chassis-within-a-chassis design doubles the protection from a potential leak of coolant fluid in comparison with a single chassis design, since both two chassis 101, 103 are designed to seal in the two-phase liquid coolant. In addition, fluid control and management modules, such as management module 111, can be designed in between internal chassis 103 and external chassis 103. That is, fluid control and management modules can be secured within external chassis 101 but exterior from two-phase liquid coolant held in internal chassis 103, thus furthering the flexibility of design for the components of the fluid control and management modules.

Figure 3:
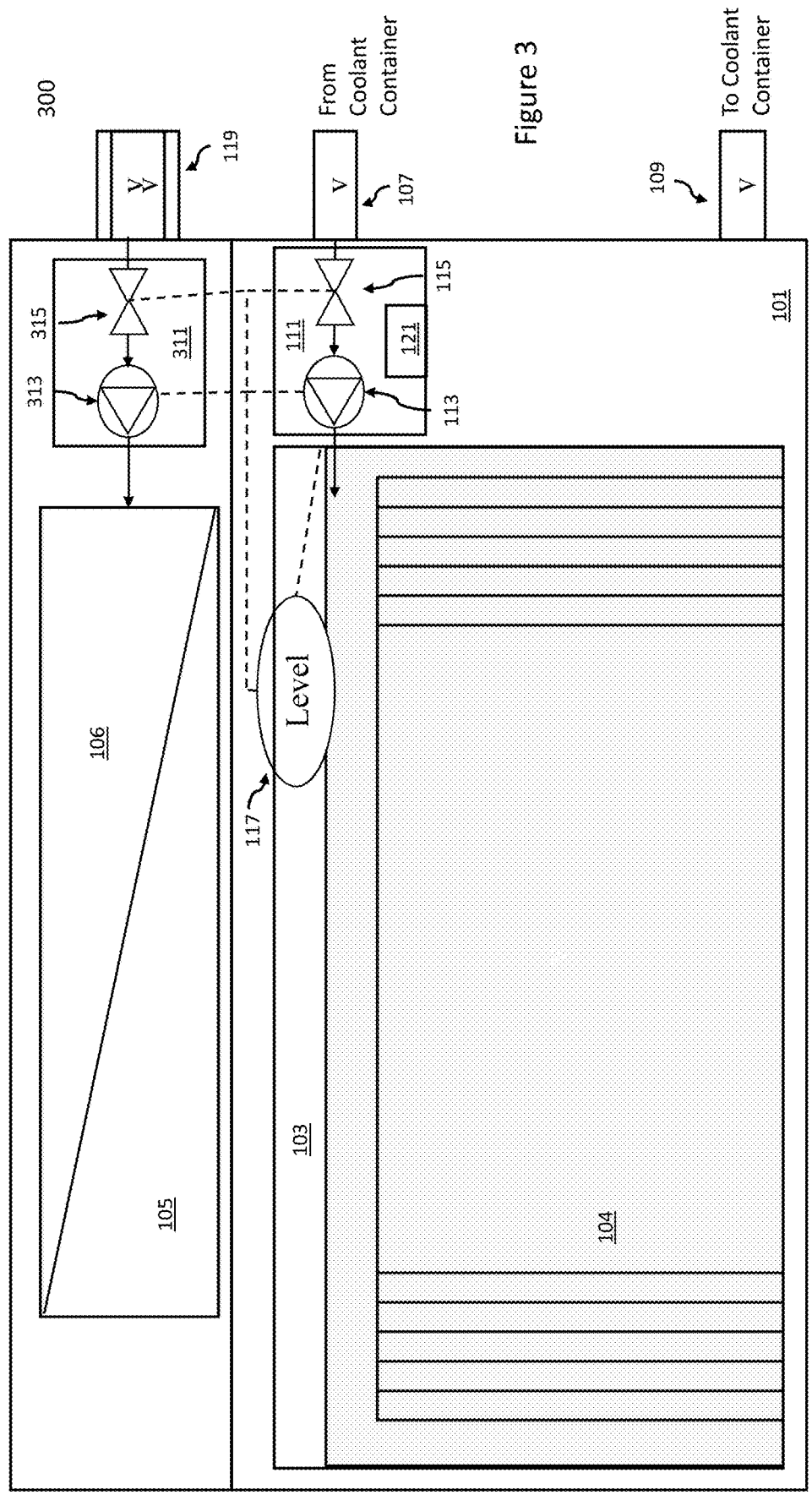
FIG. 3 is a block diagram illustrating a side view of a cooling system 100 with cooling fluid management modules according to one embodiment.

FIG. 3 is a block diagram illustrating a side view of a cooling system 300 with cooling fluid management modules 111, 311 according to one embodiment. Cooling system 300 can represent cooling system 100 of FIG. 1. As shown, cooling chassis 105 is packaged within external chassis 103. In one embodiment, cooling chassis 105 interfaces with external chassis 103 via cooling fluid management module 311. Cooling fluid management module can be used to manage the cooling fluid at cooling chassis 105. In one embodiment, cooling fluid management module 311 includes pump 313 and valve 315. Pump 313 and valve 315 can receive a signal for activation to circulate a fluid to condenser unit 106. In one embodiment, pump 313 and valve 315 receive a control signal from management module 111 or fluid level sensor 117. For example, controller 121 can receive a signal from fluid level sensor 117 to monitor a fluid level within internal chassis 103. Controller 121 can use the received signal to control pumps 113, 313 and valves 115, 315 of management modules 111, 311. In a scenario, if controller 121 detects a low fluid level (e.g., a level of two-phase liquid coolant) within internal chassis 103 via fluid level sensor 117, controller 121 can activate pumps 113, 313 and valves 115, 315 to pump cooling liquid to condenser unit 106 and two-phase liquid coolant to internal chassis 103. Thus, when the fluid level is low, controller 121 can increase a flow rate for the cooling fluid to condense the vapor back to liquid coolant faster or increase a flow rate for pumping of the two-phase liquid coolant from the coolant container (such as container 411 of FIG. 4) to internal chassis 103. The controller 121 can be tuned to provide a more optimized design. In the scenarios when fluid level reaches a high value, then controller 121 can turn on a valve (such as valve 205 of FIG. 2) to release the two-phase liquid coolant from internal chassis 103.

Figure 4:
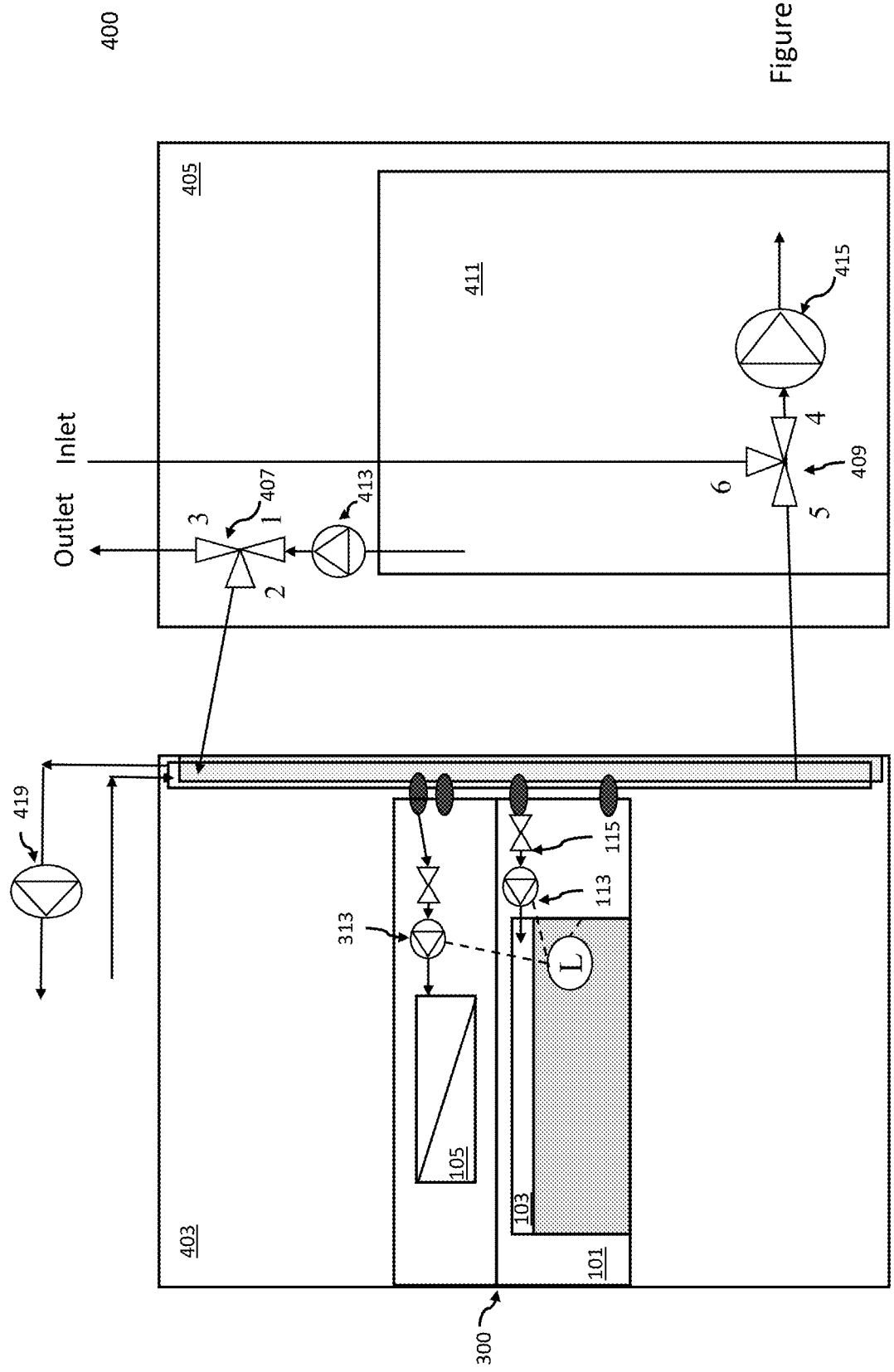
FIG. 4 is a block diagram illustrating a cooling system 100 mounted on an electronic rack according to one embodiment.

FIG. 4 is a block diagram illustrating a cooling system 300 mounted on an electronic rack 403 according to one embodiment. System 400 illustrates that cooling system 300 can be integrated with an electronic rack 403, and a coolant unit 405 adjacent to electronic rack 403 can be an intermediary to store two-phase liquid coolant for cooling system 300.

In one embodiment, coolant unit 405 can include container 411 for the intermediary storage of the two-phase liquid coolant. Coolant unit 405 can include pumps 413, 415, and three way valves 407, 409. The three way valves 407, 409 can be used to control a functionality of pumps 413, 415, respectively.

For example, charging pump 413 can be used to either pump coolant from coolant unit 405 to chassis 101, or to pump coolant from coolant unit 405 to a central coolant system (outlet) at a data center facility. Draining pump 415 can be used to either pump coolant from external chassis 101 to coolant unit 405 or to pump coolant from the central coolant system (inlet) to coolant unit 405. The following shows the states for the respective valves.

In one embodiment, for valve 407, if ports 1-2 are open, then charging pump 413 is operated to pump coolant from coolant unit 405 to chassis 101. If ports 1-3 of valve 407 are open, then charging pump 413 is operated to pump coolant from coolant unit 405 to the central coolant system (outlet).

In one embodiment, for valve 409, if ports 4-5 are open, then draining pump 415 is operated to pump coolant from chassis 101 to coolant unit 405. If ports 4-6 for valve 409 are open, then draining pump 415 is operated to pump coolant from the central coolant system (inlet) to coolant unit 405. Although three way valves are illustrated in this embodiment, different combinations of two way valves can also be used instead of the three way valves.

In one embodiment, system 400 can include circulation pump 419 to circulate a cooling liquid to be delivered to cooling chassis 105. The circulation pump 419, charging pump 407, discharge pump 409 can be designed at a rack level for fluid control and management.

In summary, cooling system 300 can be a standalone cooling system for server units/IT electronics, or can be mounted on an electronic rack, where electronic rack can include one or more of cooling system 300. Cooling system 300 includes local pumps 113 and 311, and system 400 includes recirculation pump 419, charging pump 413, and discharge pump 415. The set of five pumps 113, 311, 413, 415, and 419 shown in FIG. 4, includes some pumping redundancy and enables the failure scenario of any one pump being out of operation, and the cooling system would still remain operational. Note that although one cooling system 300 is shown, system 400 can include multiple cooling systems 300 mounted on electronic rack 403.

Figure 5:
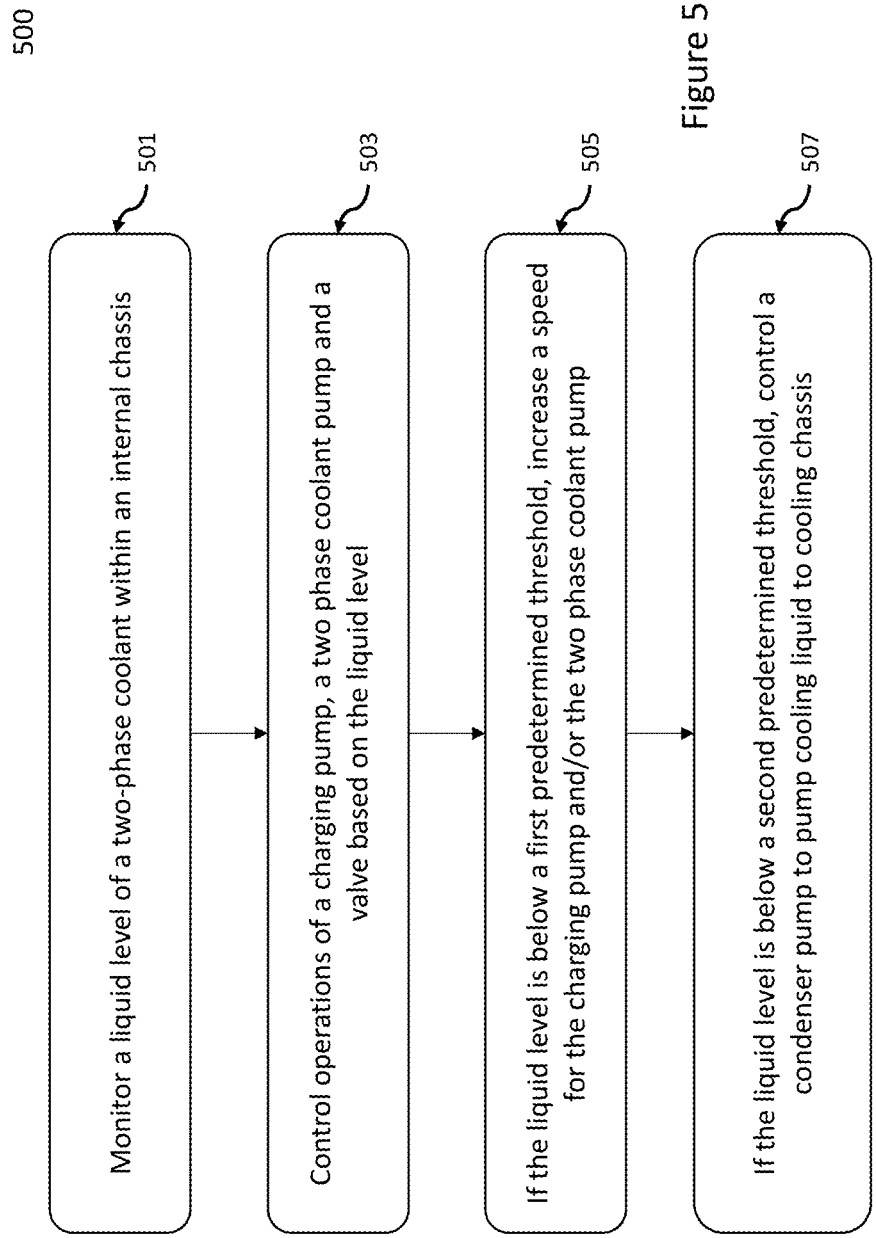
FIG. 5 is a flow diagram illustrating a method to manage cooling fluid flows according to one embodiment.

FIG. 5 is a flow diagram illustrating a method to manage cooling fluid flows according to one embodiment. Process 500 may be performed by processing logic which may include software, hardware, or a combination thereof. For example, process 500 may be performed by control 121 of cooling system 100 of FIG. 1, or cooling system 300 of FIG. 3.

Referring to FIG. 5, at block 501, processing logic monitors a liquid level of a two-phase liquid coolant within an internal chassis. Controller 121 receives a signal from fluid level sensor 117.

At block 503, processing logic controls operations of a charging pump, a two-phase coolant pump and a valve based on the liquid level.

For example, as shown in FIG. 4, controller 121 can activate charging pump 413, two-phase coolant pump 113, and/or valve 115. If valve 115 is opened, the two-phase liquid coolant is to flow to internal chassis 103, where if valve 115 is closed, the two-phase liquid coolant is to flow to an another internal chassis of another cooling system (not shown) mounted on electronic rack 403.

At block 505, if the liquid level is below a first predetermined threshold, processing logic increases a speed of the charging pump and/or the two-phase coolant pump.

For example, if the liquid level is below a first preset level, controller 121 can increases a speed of charging pump 413 and/or two-phase coolant pump 113, thereby increasing a fluid flow rate and a cooling capacity provided by the circulating fluid.

At block 507, if the liquid level is below a second predetermined threshold, processing logic controls a condenser pump 313 to pump cooling liquid to cooling chassis 105.

For example, if the liquid level is below a second preset level, controller 121 can activate cooling liquid pump 313 for additional cooling capacity.

Figure 6:
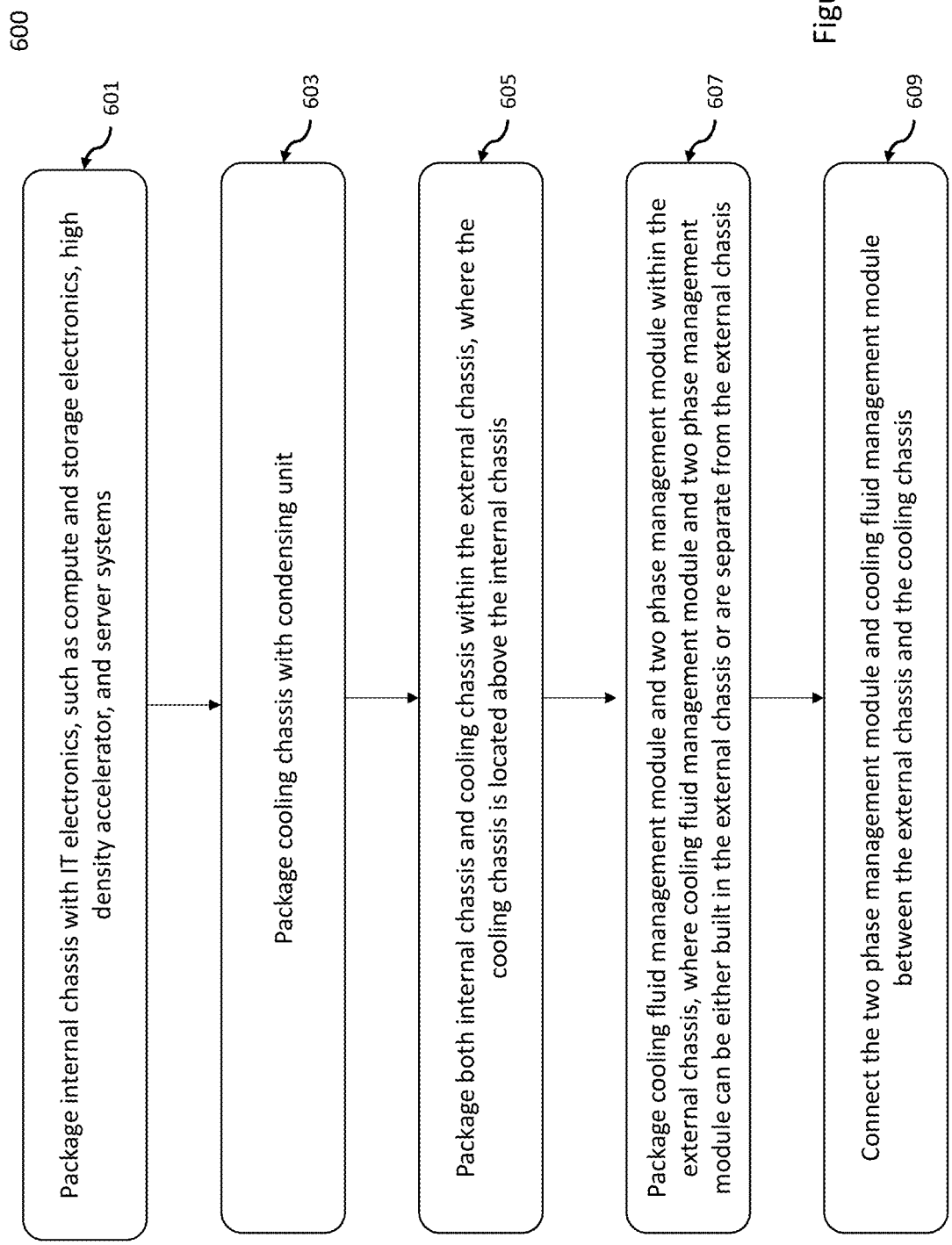
FIG. 6 is a flow diagram illustrating a method to package a server chassis according to one embodiment.

FIG. 6 is a flow diagram illustrating a method to package a server chassis according to one embodiment. Process 600 may be performed by processing logic which may include software, hardware, or a combination thereof. For example, process 600 may be performed by an automated packaging process at a manufacturing facility.

Referring to FIG. 6, at block 601, processing logic packages internal chassis 103 with IT electronics such as computing and storage electronics, high density accelerators, and server systems.

At block 603, processing logic packages cooling chassis 105 with a condenser unit 106, e.g., condenser.

At block 605, processing logic packages both internal chassis 103 and cooling chassis 105 within external chassis 101, where cooling chassis 105 is located above internal chassis 103.

At block 607, processing logic packages fluid management module 311 and two-phase management module 111 within external chassis 101. In one embodiment, cooling management module 311 and two-phase management module 111 can either be built into external chassis 101 or are modules separate from external chassis 101.

At block 609, processing logic connects two-phase management module 111 and cooling management module 311 between external chassis 101 and internal chassis 103, and external chassis 101 and cooling chassis 105, respectively.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronics system packaging, the electronic system packaging comprising:
an external chassis;
an internal chassis housed within the external chassis;
a condenser chassis housed within the external chassis, the condenser chassis situated on top of the internal chassis;
a condenser unit housed in the condenser chassis to condense a two-phase coolant from a vapor phase to a liquid phase;
information technology (IT) electronics housed within the internal chassis, wherein the IT electronics are at least partially submerged within the liquid phase of the two-phase coolant and wherein, when the IT electronics operate, the IT electronics generate heat that is transferred to the liquid phase of the two-phase coolant thereby causing at least some of the liquid phase to turn into the vapor phase; and
a two-phase coolant management module housed within the external chassis but outside the internal chassis, wherein the two-phase coolant management module is coupled between a first inlet port of the external chassis and an inlet port of the internal chassis, and wherein the two-phase coolant management module is to regulate a flow of the liquid phase of the two-phase coolant from a coolant unit to the IT electronics within the internal chassis.

2. The electronics system packaging of claim 1, further comprising a liquid level sensor coupled to the internal chassis to sense a level of the liquid phase of the two-phase coolant contained within the internal chassis.

3. The electronics system packaging of claim 2, wherein the liquid level sensor is coupled to the two-phase coolant management module to cause the two-phase coolant management module to regulate a flow of the liquid phase of the two-phase coolant.

4. The electronics system packaging of claim 2, further comprising a cooling liquid management module housed within the external chassis but outside of the condenser chassis.

5. The electronics system packaging of claim 4, wherein the cooling liquid management module couples a second inlet port of the external chassis to an inlet port of the condenser chassis, and wherein the cooling liquid management module is to regulate a flow of a cooling liquid to the condenser unit within the condenser chassis.

6. The electronics system packaging of claim 2, wherein the liquid level sensor is coupled to the two-phase coolant management module and the cooling liquid management module to cause the two-phase coolant management module to regulate a flow of the liquid phase of the two-phase coolant and to cause the cooling liquid management module to regulate a flow of the cooling liquid.

7. The electronics system packaging of claim 1, wherein the internal chassis housed within the external chassis comprises a plurality of internal chassis, wherein each of the plurality of internal chassis houses corresponding IT electronics that provide IT services.

8. The electronics system packaging of claim 7, wherein each of the plurality of internal chassis comprises a corresponding fluid level sensor coupled to the internal chassis and a corresponding two-phase coolant management module, wherein the corresponding fluid level sensor to cause the corresponding two-phase coolant management module to regulate a flow of the liquid phase of the two-phase coolant from a coolant unit to the internal chassis.

9. An information technology (IT) equipment cooling system, comprising:
a coolant unit to supply a liquid phase of a two-phase coolant, the two-phase coolant also having a vapor phase; and
a cooling loop to deliver cooling liquid; and
an electronics system packaging coupled to the coolant unit and connected to the cooling loop, the electronics system packaging comprising:
an external chassis;
an internal chassis housed within the external chassis;
a condenser chassis housed within the external chassis, the condenser chassis situated on top of the internal chassis;

a condenser unit housed in the condenser chassis to condense the two-phase coolant from the vapor phase to the liquid phase; and information technology (IT) electronics housed within the internal chassis, wherein the IT electronics are at least partially submerged within the liquid phase of the two-phase coolant and wherein, while the IT electronics provide IT services, the IT electronics generate heat that is transferred to the liquid phase of the two-phase coolant thereby causing at least some of the liquid phase to turn into the vapor phase; and a two-phase coolant management module housed within the external chassis but outside the internal chassis, wherein the two-phase coolant management module is coupled between a first inlet port of the external chassis and an inlet port of the internal chassis, and wherein the two-phase coolant management module is to regulate a flow of the liquid phase of the two-phase coolant from the coolant unit to the IT electronics within the internal chassis.

10. The IT equipment cooling system of claim 9, further comprising a liquid level sensor coupled to the internal chassis to sense a level of the liquid phase of the two-phase coolant contained within the internal chassis.

11. An electronics system packaging, the electronic system packaging comprising:
an external chassis;
an internal chassis housed within the external chassis;
a condenser chassis housed within the external chassis, the condenser chassis situated on top of the internal chassis;
a condenser unit housed in the condenser chassis to condense a vapor phase of a two-phase coolant into a liquid phase of the two-phase coolant;
information technology (IT) electronics housed within the internal chassis, wherein the IT electronics are at least partially submerged within the liquid phase of the two-phase coolant and wherein, when the IT electronics operate, the IT electronics generate heat that is transferred to the liquid phase of the two-phase coolant thereby causing at least some of the liquid phase to turn into the vapor phase; and
a cooling liquid management module housed within the external chassis but outside the condenser chassis, wherein the cooling liquid management module couples a second inlet port of the external chassis to an inlet port of the condenser chassis, and wherein the cooling liquid management module is to regulate a flow of cooling liquid to the condenser unit within the condenser chassis.

12. The electronics system packaging of claim 11, further comprising a liquid level sensor coupled to the internal chassis to sense a level of the liquid phase of the two-phase coolant contained within the internal chassis.

13. The electronics system packaging of claim 12, wherein the liquid level sensor is to cause a two-phase coolant management module to regulate a flow of the liquid phase of the two-phase coolant and is to cause the cooling liquid management module to regulate a flow of the cooling liquid.

14. The electronics system packaging of claim 11, wherein the internal chassis housed within the external chassis comprises a plurality of internal chassis, wherein each of the plurality of internal chassis houses corresponding IT electronics that provide IT services.

15. The electronics system packaging of claim 14, wherein each of the plurality of internal chassis comprises a corresponding fluid level sensor coupled to the internal chassis and a corresponding two-phase coolant management module, wherein the corresponding fluid level sensor to cause the corresponding two-phase coolant management module to regulate a flow of the liquid phase of the two-phase coolant from a coolant unit to the internal chassis.

16. An information technology (IT) equipment cooling system, comprising:
a coolant unit to supply a liquid phase of a two-phase coolant, the two-phase coolant also having a vapor phase; and
a cooling loop to deliver cooling liquid; and
an electronics system packaging coupled to the coolant unit and connected to the cooling loop, the electronics system packaging comprising:
an external chassis;
an internal chassis housed within the external chassis;
a condenser chassis housed within the external chassis, the condenser chassis situated on top of the internal chassis;
a condenser unit housed in the condenser chassis to condense the two-phase coolant from the vapor phase to the liquid phase; and
information technology (IT) electronics housed within the internal chassis, wherein the IT electronics are at least partially submerged within the liquid phase of the two-phase coolant and wherein, while the IT electronics provide IT services, the IT electronics generate heat that is transferred to the liquid phase of the two-phase coolant thereby causing at least some of the liquid phase to turn into the vapor phase; and
a cooling liquid management module housed within the external chassis but outside the condenser chassis, wherein the cooling liquid management module couples a second inlet port of the external chassis to an inlet port of the condenser chassis, and wherein the cooling liquid management module is to regulate a flow of cooling liquid to the condenser unit within the condenser chassis.

17. The IT equipment cooling system of claim 16, further comprising a liquid level sensor coupled to the internal chassis to sense a level of the liquid phase of the two-phase coolant contained within the internal chassis.

* * * * *